United States Patent [19]  [11] Patent Number: 5,444,020
Lee et al.  [45] Date of Patent: Aug. 22, 1995

| | | |
|---|---|---|
| 5,300,456 | 4/1994 | Tigelaar et al. ............... 437/195 |
| 5,317,193 | 5/1994 | Watanabe ........................ 257/774 |
| 5,320,979 | 6/1994 | Hashimoto et al. ............ 437/192 |

[54] METHOD FOR FORMING CONTACT HOLES HAVING DIFFERENT DEPTHS

[75] Inventors: Seung-ku Lee, Kwangmyeong; Kyung-seok Oh, Suwon, both of Rep. of Korea

[73] Assignee: Samsung Electronics Co., Ltd., Suwon, Rep. of Korea

[21] Appl. No.: 135,495

[22] Filed: Oct. 13, 1993

[30] Foreign Application Priority Data

Oct. 13, 1992 [KR] Rep. of Korea ............... 92-18791

[51] Int. Cl.6 ........................................ H01L 21/44
[52] U.S. Cl. ............................ 437/195; 148/DIG. 51; 437/189; 437/228; 437/981; 257/774; 257/775
[58] Field of Search ............... 437/195, 981, 947, 237, 437/978, 189, 183, 228; 148/DIG. 51, DIG. 161; 257/774, 775, 773; 156/644, 643, 625

[56] References Cited

U.S. PATENT DOCUMENTS

| | | | |
|---|---|---|---|
| 4,714,686 | 12/1987 | Sander et al. ...................... | 437/195 |
| 4,764,484 | 8/1988 | Mo ....................................... | 437/195 |
| 4,800,176 | 1/1989 | Kakumu et al. ................... | 437/193 |
| 4,933,297 | 6/1990 | Lu ........................................ | 437/192 |
| 5,006,484 | 4/1991 | Harada ................................ | 457/235 |
| 5,192,713 | 3/1993 | Harada ................................ | 437/192 |
| 5,198,389 | 3/1993 | Van Der Putten et al. ...... | 437/195 |
| 5,210,053 | 5/1993 | Yamagata ........................... | 437/192 |

FOREIGN PATENT DOCUMENTS

| | | | |
|---|---|---|---|
| 0032642 | 2/1982 | Japan ................................. | 437/195 |
| 0150941 | 6/1988 | Japan ................................. | 437/195 |
| 0214046 | 8/1989 | Japan ................................. | 437/195 |
| 0007432 | 1/1990 | Japan ................................. | 437/195 |
| 0105520 | 4/1990 | Japan ................................. | 437/195 |
| 0134849 | 5/1990 | Japan ................................. | 437/195 |
| 0151034 | 6/1990 | Japan ................................. | 437/195 |

*Primary Examiner*—Olik Chaudhuri
*Assistant Examiner*—Long Pham
*Attorney, Agent, or Firm*—Charles R. Donohoe; Robert A. Westerlund, Jr.; Stephen R. Whitt

[57] ABSTRACT

A method for forming contact holes having different depths in an insulating layer which covers a semiconductor substrate. A first step selectively etches the upper parts of the insulating layer which correspond to contact holes having a greater depth than the shallowest contact hole, using a first mask pattern. A second etch step selectively etches the remainder of the insulating layer for all of the contact holes at the same time using a second mask pattern. Thus, contact hole misalignment is kept to a minimum.

15 Claims, 6 Drawing Sheets

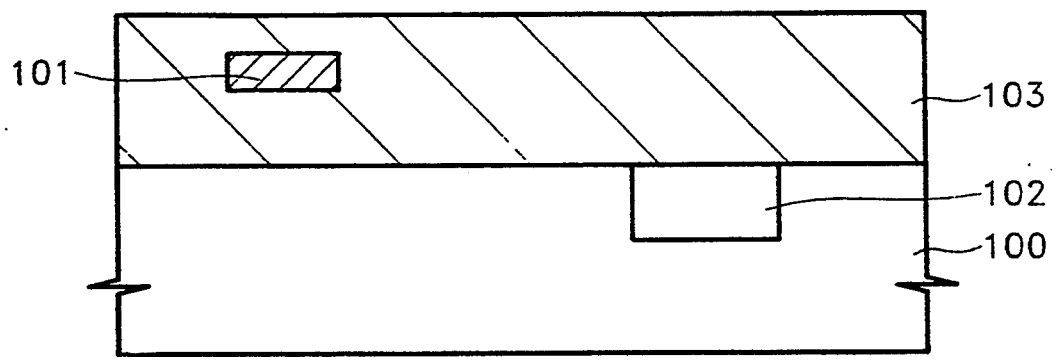
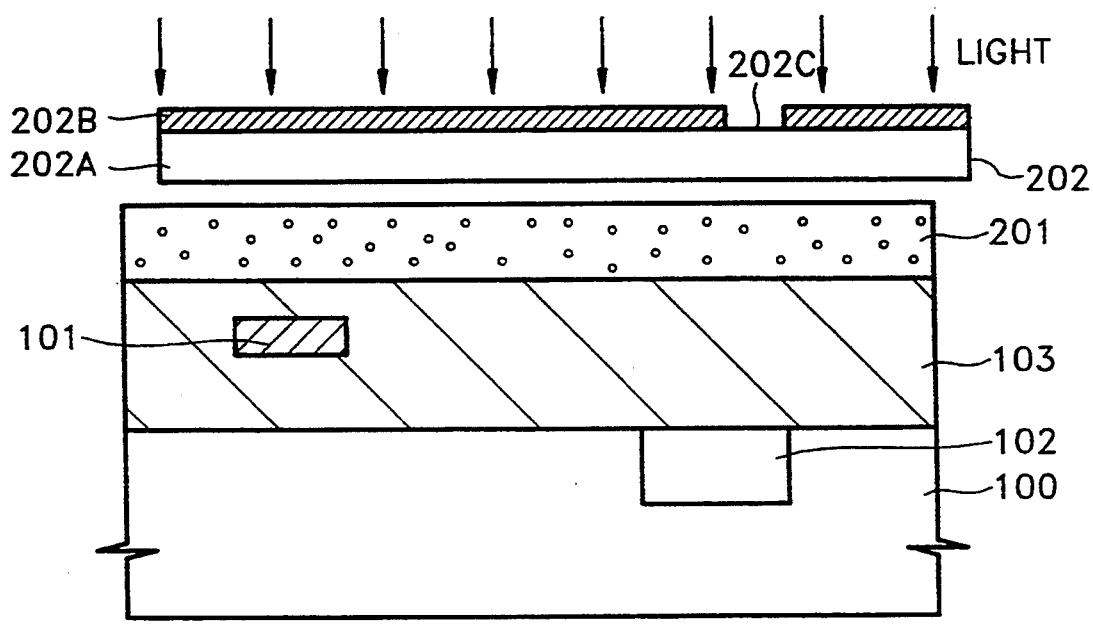
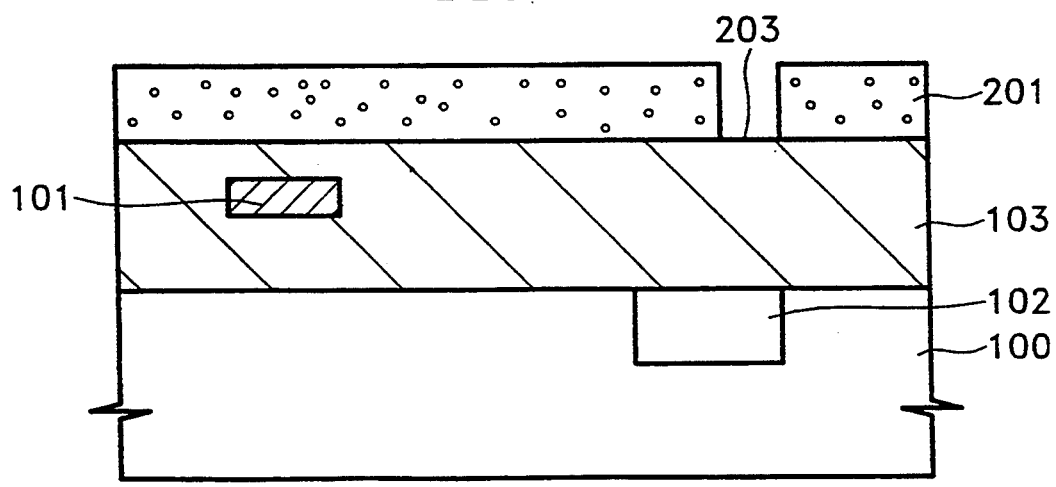

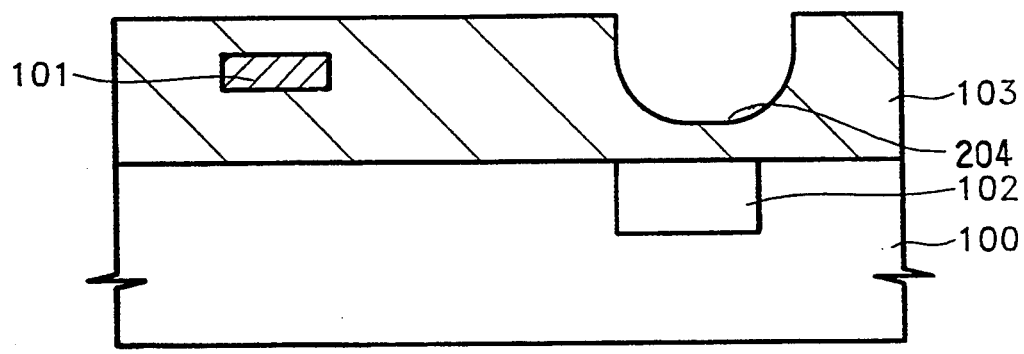
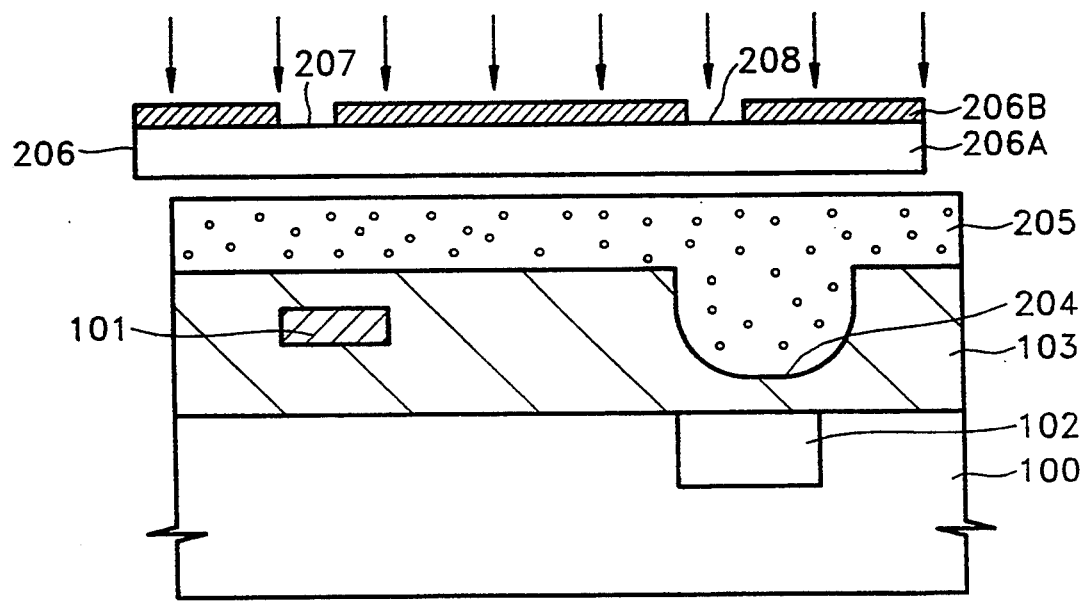
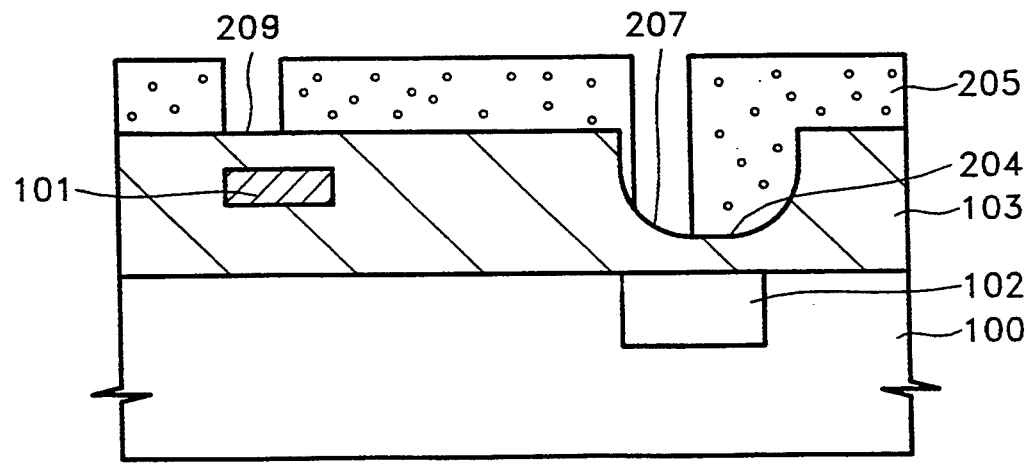

METHOD FOR FORMING CONTACT HOLES HAVING DIFFERENT DEPTHS

BACKGROUND OF THE INVENTION

1. Field of the Invention

The present invention relates to a method for forming contact holes in a semiconductor device, and more particularly, to a method for forming contact holes having different depths.

2. Background of the Related Art

In a semiconductor device, a plurality of regions or layers are formed that are subsequently interconnected to create components and circuitry. The interconnection between one conductive layer and another conductive region through an insulating layer such as a silicon oxide layer is known as a contact. This contact is made by inserting a conducting material into a previously made contact hole. A contact hole is formed by selectively etching the insulation layer. Specifically, a photoresist is first applied as a thin film to the insulting layer and subsequently exposed through a mask. The mask contains clear and opaque features that define the pattern of a contact hole. The area of the photoresist film which is exposed to light is soluble (in the case of a positive, photoresist) and the exposed portion is removed in a subsequent development process. The remainder of the photoresist film acts as an etch-mask. A succeeding etching step removes the exposed part of the insulating layer but does not remove the insulating layer located under the photoresist mask. This results in the formation of a contact hole.

It is also known to etch a plurality of contact holes having different depths.

FIG. 1 through FIG. 8 are cross-sectional views of intermediate structures formed during a conventional process of forming contact holes having different depths.

FIG. 1, illustrates a semiconductor substrate 100, a first conductive layer 101 and a second conductive layer 102. The thickness of the portion of insulating layer 103 that cover first conductive layer 101 is different from the thickness of the portion of insulating layer 103 that covers the second conductive layer 102. Thus, the contact hole required for exposing first conductive layer 101 has a different depth from that required for exposing second conductive layer 102.

Referring to FIG. 2, photoresist film 104 is applied to insulating layer 103 and then is developed through mask pattern 105, which is typically applied over the photoresist film 104 with some degree of misalignment. Mask pattern 105 may be constituted by a glass 105A which is selectively coated with chromium 105B into which there is opened a window 105C.

As shown from FIG. 3, through window 105C, the exposed part 106 of photoresist film 104 is removed by a solution. As a result, photoresist film 104 is patterned to form an etching mask. Therefore, as shown in FIG. 4, part of insulating layer 103 located over first conductive layer 101, is also etched, with the same degree of misalignment, resulting in the formation of a first contact hole 107.

Thereafter, in order to form a second contact hole, another photoresist film 108 is applied to the surface of insulating layer 103 having a first contact hole 107 etched as depicted in FIG. 5. Then, another mask pattern 109 is laid over photoresist film 108, which typically exhibits misalignment in another direction. The mask pattern 109 is similarly made by a mask substrate 109A such as glass which is covered with chromium 109B into which there is opened a window 109C.

As shown from FIG. 6, the exposed part 110 of the photoresist film 108 is developed to form an etching mask for the second contact hole. Subsequent etching transfers the etching mask pattern to insulating layer 103, resulting in a second contact hole 111, as shown in FIG. 7. Thus, with the conventional method of forming multiple contact holes such as first contact hole 107 and second contact hole 111, the contact holes are formed and have differing misalignments.

Thus, when a metallization process as shown in FIG. 8 is performed, metal wirings 112 and 113, intended to be located in alignment with contact holes 107 and 111, have a considerable step coverage deficiency due to the misalignments of the contact holes.

SUMMARY OF THE INVENTION

Accordingly, the object of the present invention is to provide a method for forming contact holes having different depths and which provides a proper.

The other object of the present invention is to provide a process for interconnection that does not suffer from misalignment defects.

To attain the object of the present invention, there is provided a method for forming contact holes having different depths in an insulating layer that covers a semiconductor substrate.

BRIEF DESCRIPTION OF THE DRAWINGS

FIGS. 9–16 represent cross-sectional views of intermediate structures for forming contact holes and metallizations applied thereto sequentially formed in the interconnection process according to the present invention.

DETAILED DESCRIPTION OF THE PREFERRED EMBODIMENT

Figure 1:
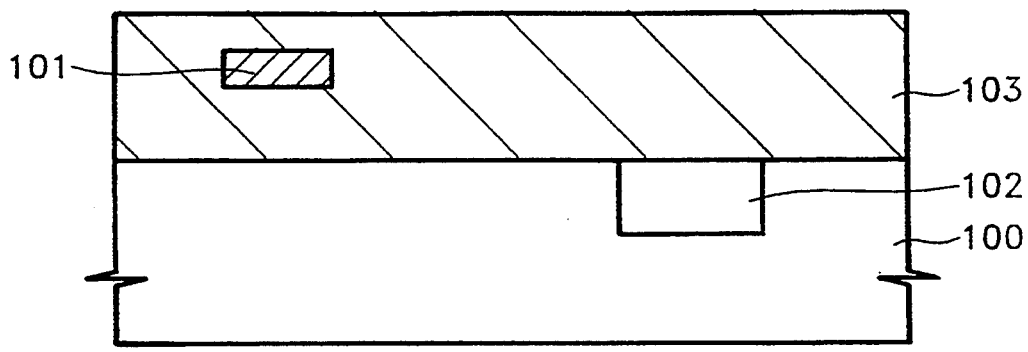
FIGS. 1–8 are cross-sectional views of intermediate structures for forming conventional contact holes having different depths and metallizations applied thereto.
Figure 2:
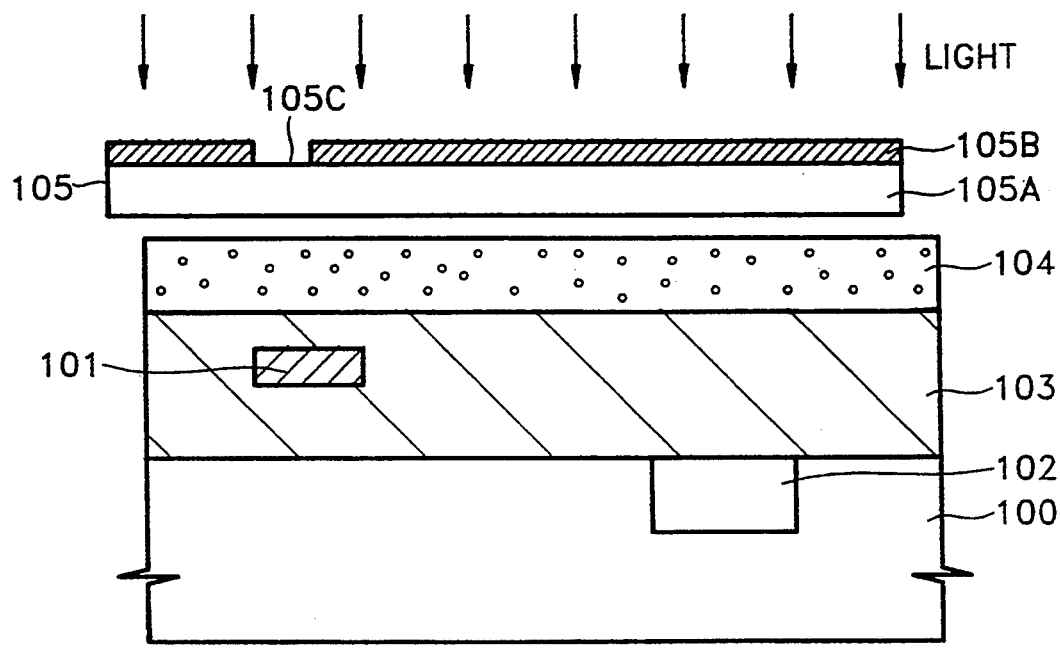
Figure 3:
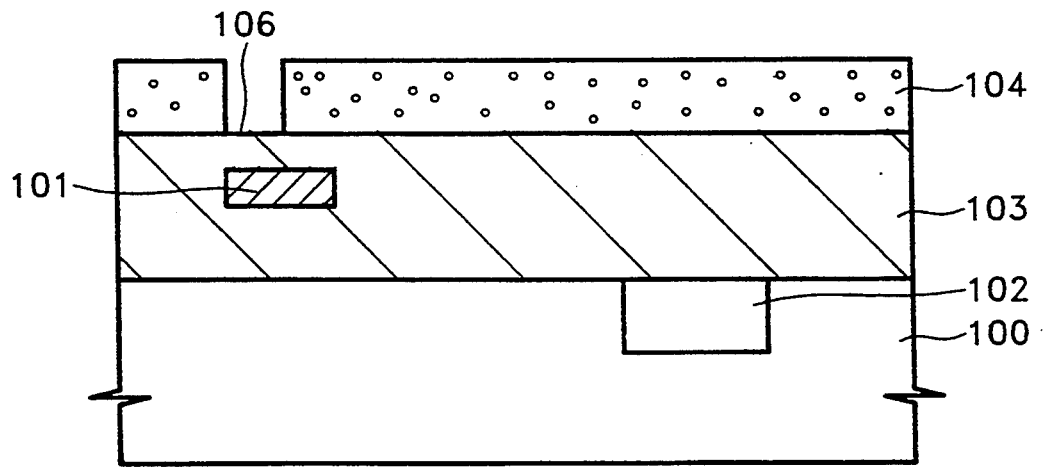
Figure 4:
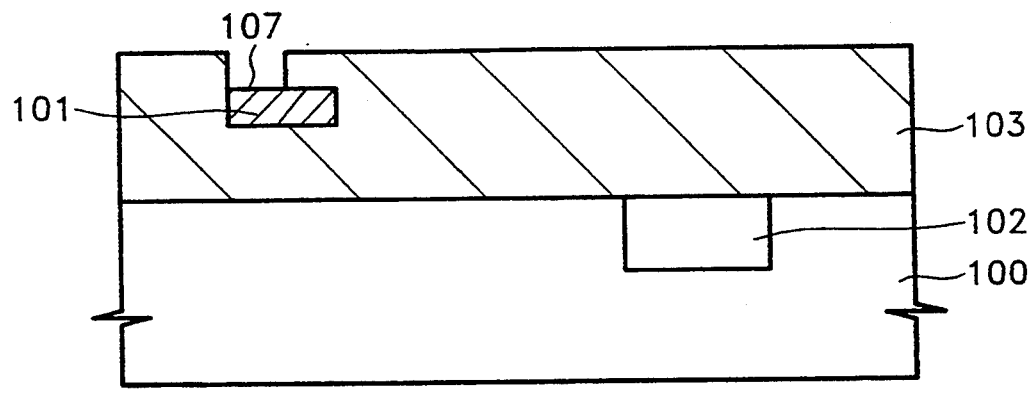
Figure 5:
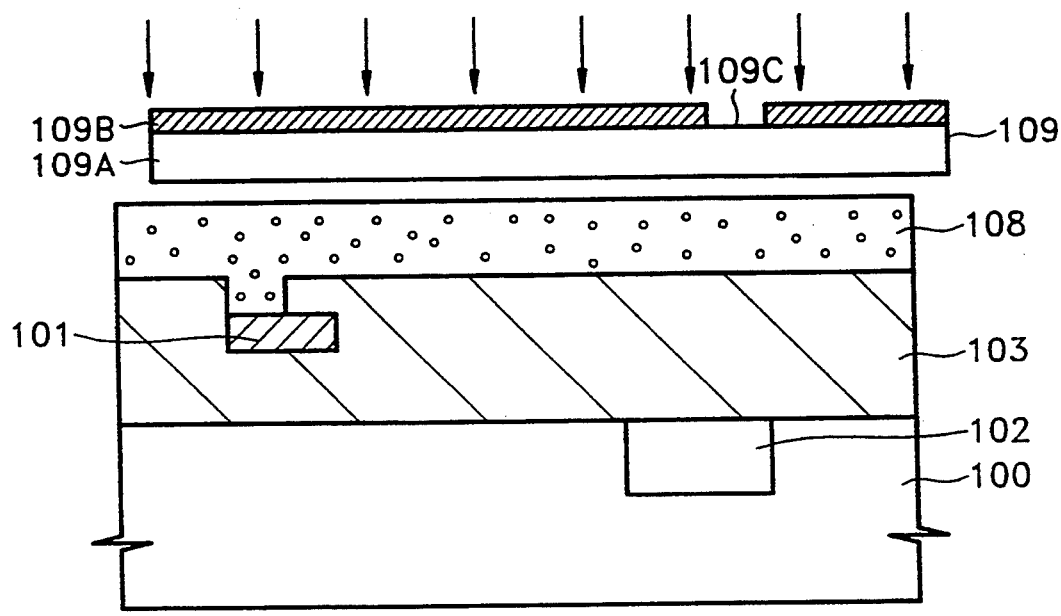
Figure 6:
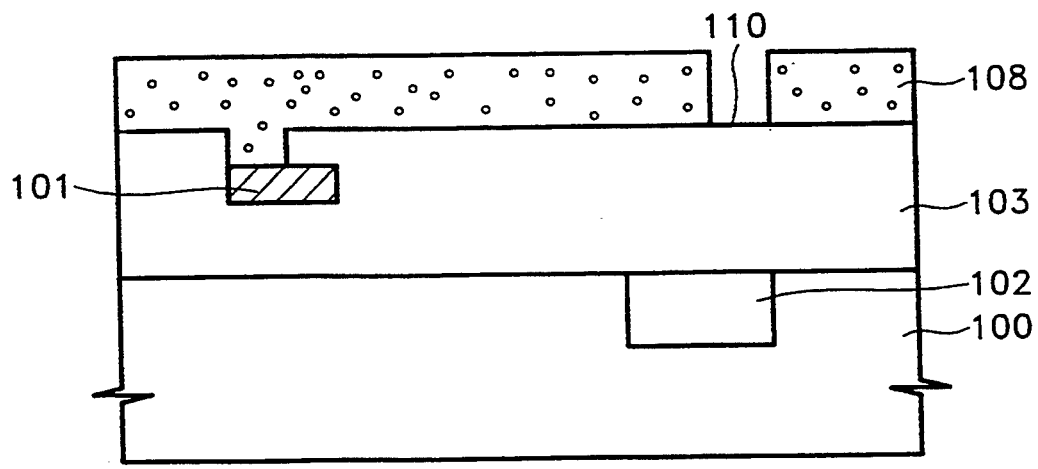
Figure 7:
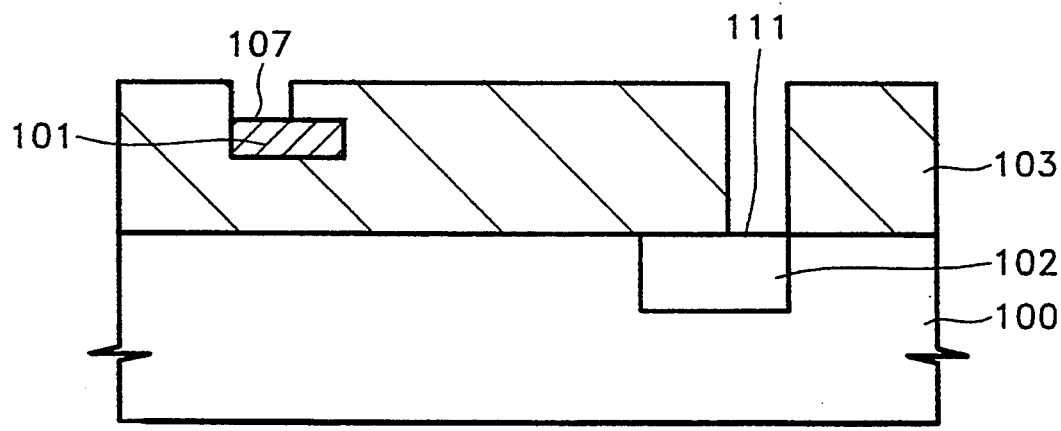
Figure 8:
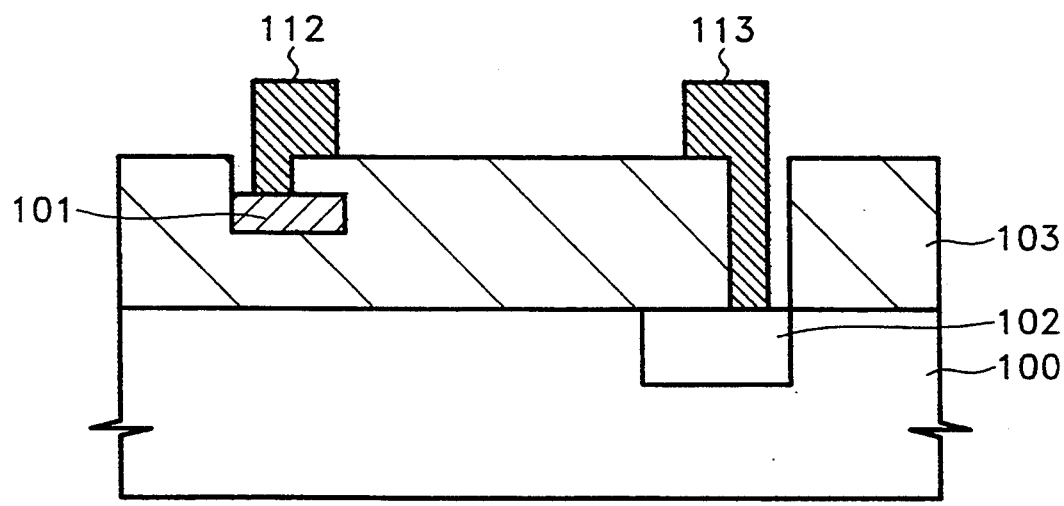

The method forming contact holes according to the present invention will be described with reference to FIGS. 9–15.

Referring to FIG. 9, first conductive layer 101 and second conductive layer 102 are covered with insulating layer 103. The thickness of insulating layer 103 portion overlying first conductive layer 101 is different from that portion overlying second conductive layer 102. Reference numeral 100 represents the substrate of the semiconductor device.

In FIG. 10, photoresist film 201 is applied to insulating layer 103 and then first mask pattern 202 is laid over photoresist film 201. First mask pattern 202 is constituted by mask substrate 202A which is transparent and selectively coated with chromium 202B into which there is opened a window 202C above the lower conductive layer, which, in the example provided, is second conductive layer 102.

Referring to FIG. 11, the exposed part of photoresist film 201 is removed to form window 203. Then, as shown in FIG. 12, an the upper part 204 of insulating layer 103 is selectively etched, using the photoresist film having window 203 as an etch mask. Thus, the first etching step does not form a contact hole but preferably etches vertically downward so that the remaining insulating material 103 has a depth approximately equal the depth of insulating material 103 disposed over the uppermost conductive layer, which, in this example, is first conductive layer 101. This etching step also performs lateral as well as vertical etching so that a wide area is etched to ensure that, even with misalignments, the portion of the insulating layer that will be subsequently etched has the proper depth. Subsequently, photoresist film 201 is removed.

Figure 15:
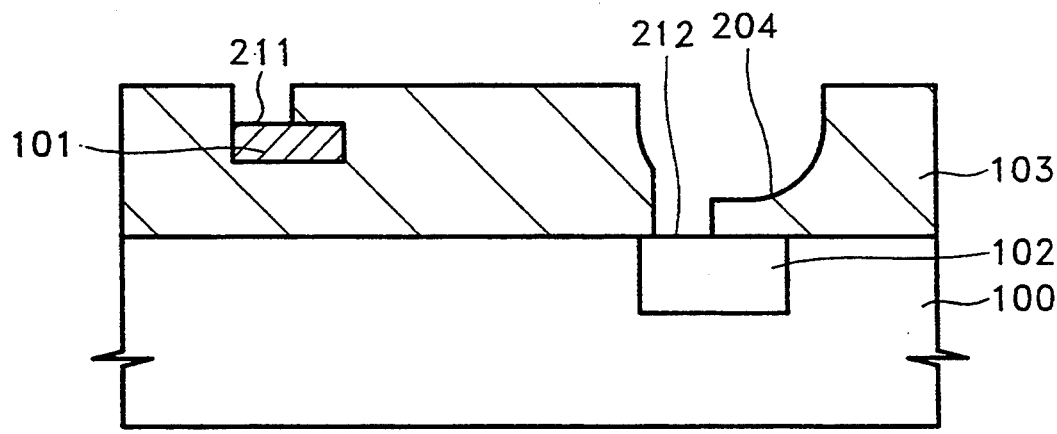
Figure 16:
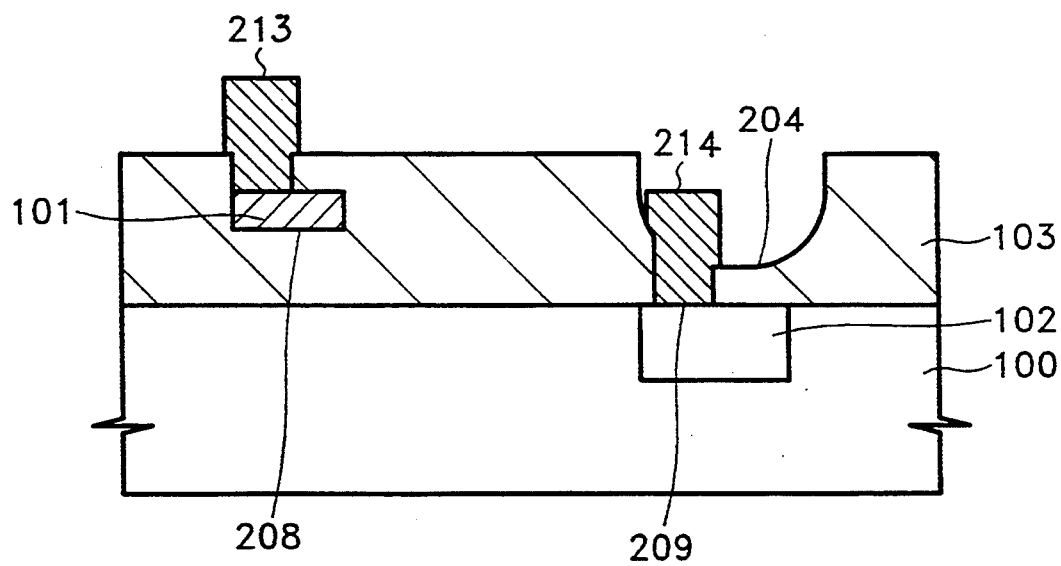

Thereafter, as shown from FIG. 13, another photoresist film 205 is applied to insulating layer 103, including the upper part 204 previously etched. Then, a mask pattern 206, having two windows 207 and 208 for the example provided, is located over the photoresist film 205, albeit with some degree of misalignment. Mask pattern 206 has clear and opaque features due to chromium 206B being selectively coated on a mask substrate 206A. The incident light through windows 207 and 208 chemically convert photoresist film 205. The chemically converted part of photoresist film 205 is removed to form two windows 209 and 210, as shown in FIG. 14. Photoresist film 205 having windows 209 and 210 is used as an etch mask when the underlying insulating layer 103 is etched. A subsequent etching steps forms two contact holes 211 and 212 in insulating layer 103. Contact holes 211 and 212 expose first conductive layer 101 and second conductive layer 102, respectively, as shown in FIG. 15. This etching step is preferably performed in only vertical etching direction. The method according to the present invention, includes a first etching step for removing an upper part of the insulating layer which corresponds to the deeper contact holes and a second etching step for opening all contact holes. The contact hole misalignment thus occurs in one direction only, which thereby overcomes many of the troubles due to mask pattern misalignment. Therefore, the step coverage deficiency is reduced during subsequent metallization processing.

Metallization is subsequently performed to form metal layers 213 and 214, which are appropriately aligned to fill the respective contact holes.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for forming a plurality of contact holes having different depths in an insulating layer that covers a semiconductor substructure comprising the steps of:
   partially etching a first etch region in an upper portion of said insulating layer using a first mask pattern; and
   simultaneously etching said etched first etch region and a second etch region spaced away from said etched first etch region using a second mask pattern to thereby form first and second contact holes respectively which expose said semiconductor substructure.

2. The method for forming contact holes according to claim 1, wherein said step of etching said first etch region is performed in vertical and lateral directions.

3. The method for forming contact holes according to claim 1, wherein said first mask pattern and said second mask pattern include a photoresist mask film.

4. The method for forming contact holes according to claim 1, wherein said step of etching said first and second etch regions is performed in a vertical direction.

5. The method for forming contact holes according to claim 2, wherein said step of etching said first and second etch regions is performed in a vertical direction.

6. The method for forming contact holes according to claim 1, wherein said step of partially etching said first etch region etches said insulating layer so that a depth of said insulating layer at said first etch region corresponds to a depth of said semiconductor substructure within said insulating layer at said second etch region.

7. The method for forming contact holes according to claim 5, wherein said step of partially etching said first etch region etches said insulating layer so that a depth of said insulating layer at said first etch region corresponds to a depth of said semiconductor substructure within said insulating layer at said second etch region.

8. A method for interconnecting conducting layers to a conductive semiconductor substructure through contact holes having different depths in an insulating layer, comprising the steps of:
   partially etching a first etch region in an upper portion of said insulating layer using a first mask pattern;
   etching said etched first etch region and a second etch region spaced away from said first etch region using a second mask pattern to form first and second contact holes, respectively, which expose respective portions of said semiconductor substructure; and
   forming said conductive layers which contact said respective portions of said semiconductor substructure through said first and second contact holes.

9. A method for interconnecting conducting layers according to claim 8, wherein said conductive layers are metal layers.

10. A method for interconnecting conducting layers according to claim 8, wherein said step of etching said first etch region is performed in vertical and lateral directions.

11. A method for interconnecting conducting layers according to claim 8, wherein said first mask pattern and said second mask pattern each include a photoresist mask film.

12. A method for interconnecting conducting layers according to claim 8, wherein said step of etching said first and second contact holes is performed in a vertical direction.

13. A method for interconnecting conducting layers according to claim 10, wherein said step of etching said first and second contact holes is performed in a vertical direction.

14. A method for interconnecting conducting layers according to claim 8, wherein said step of etching said first etch region etches said insulating layer so a depth of said insulating layer at said first etch region corresponds to a depth of said semiconductor substructure within said insulating layer at said second etch region.

15. A method for interconnecting conductive layers according to claim 12, wherein said step of etching said first etch region etches said insulating layer so a depth of said insulating layer said first etch region corresponds to a depth of said semiconductor substructure within said insulating layer at said second etch region.

* * * * *